(12) United States Patent
Samoilov et al.

(10) Patent No.: US 8,742,574 B2
(45) Date of Patent: Jun. 3, 2014

(54) SEMICONDUCTOR DEVICE HAVING A THROUGH-SUBSTRATE VIA

(75) Inventors: Arkadii V. Samoilov, Saratoga, CA (US); Tyler Parent, Pleasanton, CA (US); Xuejun Ying, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 62 days.

(21) Appl. No.: 13/205,682

(22) Filed: Aug. 9, 2011

(65) Prior Publication Data

US 2013/0037948 A1 Feb. 14, 2013

(51) Int. Cl.
*H01L 23/48* (2006.01)
*H01L 21/44* (2006.01)

(52) U.S. Cl.
USPC ........... 257/734; 257/738; 257/762; 257/774; 257/E21.597; 257/E21.705; 257/E23.011; 372/50.1; 438/455; 438/459; 438/622; 438/667

(58) Field of Classification Search
USPC .................. 257/734, 738, 762, 774, E21.597, 257/E21.705, E23.011; 372/50.1; 438/455, 438/459, 622, 667
See application file for complete search history.

(56) References Cited

U.S. PATENT DOCUMENTS

| | | | | |
|---|---|---|---|---|
| 7,410,884 B2 * | 8/2008 | Ramanathan et al. | ......... | 438/455 |
| 7,538,033 B2 * | 5/2009 | Trezza | .......................... | 438/667 |
| 7,884,015 B2 * | 2/2011 | Sulfridge | ...................... | 438/667 |
| 2005/0286585 A1 * | 12/2005 | Guenter et al. | ............. | 372/50.1 |
| 2006/0057836 A1 * | 3/2006 | Nagarajan et al. | ............ | 438/622 |
| 2007/0045836 A1 * | 3/2007 | Kwon et al. | .................. | 257/734 |

* cited by examiner

*Primary Examiner* — Dao H Nguyen
(74) *Attorney, Agent, or Firm* — Advent, LLP

(57) ABSTRACT

Semiconductor devices are described that have a through-substrate via formed therein. In one or more implementations, the semiconductor devices include a top wafer and a bottom wafer bonded together with a patterned adhesive material. The top wafer and the bottom wafer include one or more integrated circuits formed therein. The integrated circuits are connected to one or more conductive layers deployed over the surfaces of the top and bottom wafers. A via is formed through the top wafer and the patterned adhesive material so that an electrical interconnection can be formed between the integrated circuits formed in the top wafer and the integrated circuits formed in the bottom wafer. The via includes a conductive material that furnishes the electrical interconnection between the top and bottom wafers.

10 Claims, 7 Drawing Sheets

SEMICONDUCTOR DEVICE HAVING A THROUGH-SUBSTRATE VIA

BACKGROUND

Consumer electronic devices, in particular, mobile electronic devices such as smart phones, tablet computers, and so forth, increasingly employ smaller, more compact components to furnish their users with desired features. Such devices often employ three dimensional integrated circuit devices (3D IC). Three-dimensional integrated circuit devices are semiconductor devices that employ two or more layers of active electronic components. Through-substrate vias (TSV) interconnect electronic components on the different layers (e.g., different substrates) of the device allowing the devices to be integrated vertically as well as horizontally. Consequently, three-dimensional integrated circuit devices can provide increased functionality within a smaller, more compact footprint than do conventional two-dimensional integrated circuit devices.

SUMMARY

Semiconductor devices are described that include two or more substrates bonded together. Through-substrate vias (TSV) furnish electrical interconnectivity to electronic components formed in the substrates. In implementations, the semiconductor devices are fabricated by bonding two or more semiconductor wafers together using a patterned adhesive material such as a patterned dielectric. The patterned adhesive material allows for lateral expansion of the adhesive material when the wafers are pressed together during the bonding process. For example, a top wafer may be bonded to a bottom wafer by applying adhesive material to a first (upper) surface of the bottom wafer. The adhesive material is then patterned. The patterned adhesive material may then be used to bond the first (lower) surface of the top wafer to the first (upper) surface of the bottom wafer. Vias may then be formed through the top wafer and the patterned adhesive material to furnish electrical interconnection between the wafers. This process may be repeated to bond additional wafers to the second (upper) surface of the top wafer. The bonded wafers may then be segmented into individual semiconductor devices.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

Figure 1:
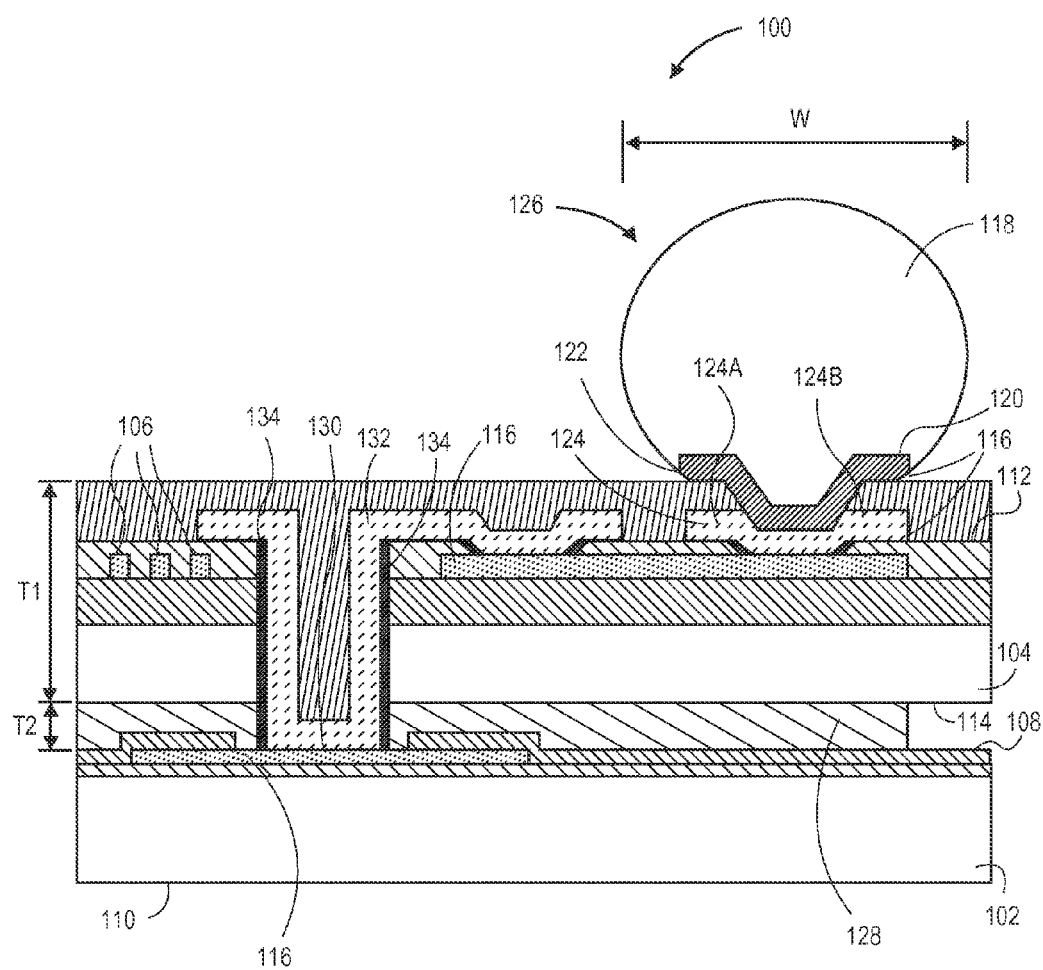
FIG. 1 is a diagrammatic partial cross-sectional view illustrating a semiconductor device at wafer level (e.g., prior to singulation of the device) in accordance with an example implementation of the present disclosure.
Figure 7:
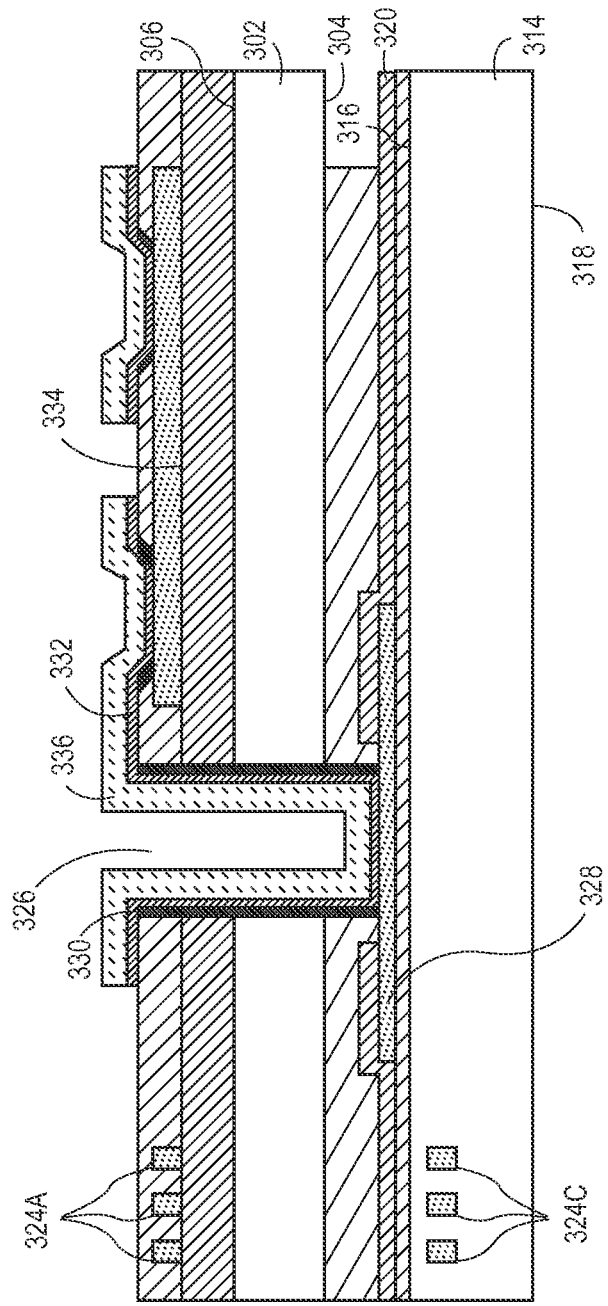

FIG. 7 is a diagrammatic partial cross-sectional view illustrating the fabrication of wafer-level packaged semiconductor devices, such as the semiconductor device shown in FIG. 1, in an example implementation, wherein a conductive material is deposited in the via to provide an interconnection between the conductive layer disposed over the bottom wafer and a conductive layer disposed over the top surface.

DETAILED DESCRIPTION

Overview

Three-dimensional integrated circuit devices are commonly manufactured using wafer-on-wafer techniques wherein electronic components (e.g., circuits) are first fabricated on two or more semiconductor wafers. The semiconductor wafers are then aligned, attached together, and segmented to provide individual devices. Through-substrate vias (TSV) are either built into the wafers before they are attached, or else created in the wafer stack after attachment. However, the fabrication of three-dimensional integrated circuit devices requires additional manufacturing steps to join the wafers together. This increases the cost of the devices. Moreover, each extra manufacturing step adds a risk for inducing defects, possibly reducing the devices' yield.

Therefore, techniques are described to fabricate semiconductor devices having multiple, stacked die (substrate) in a reliable, production-worthy way. In one or more implementations, the semiconductor devices include at least a top die and a bottom die bonded together via an adhesive material. The top and bottom dies include one or more integrated circuits formed therein. Through-substrate vias (TSV) are formed through the top die and the adhesive material disposed between the dies. The through-substrate vias include a conductive material, such as copper, that furnishes electrical interconnection between the integrated circuits. It is contemplated that additional dies (substrates) may be provided in a stacked arrangement with the first and second die and bonded thereto, thereby providing a device having three or more layers.

The semiconductor devices are fabricated by bonding semiconductor wafers together using a patterned adhesive material, such as a patterned dielectric (e.g. benzocyclobutene), and so on. The patterned adhesive material allows for lateral expansion of the adhesive material when the wafers are pressed together during the bonding process. For example, a top wafer may be bonded to a bottom wafer by applying adhesive material to a first (upper) surface of the bottom wafer. The adhesive material is then patterned. The patterned adhesive material may then be used to bond the first (bottom) surface of the top wafer to the first (top) surface of the bottom wafer. Through-substrate vias may then be formed through the top wafer and the patterned adhesive material to furnish electrical interconnection between the wafers. This process may be repeated to bond additional wafers to the second (top) surface of the top wafer. The bonded wafers may then be segmented into individual semiconductor devices.

In the following discussion, an example semiconductor device is first described. Exemplary procedures are then described that may be employed to fabricate the example semiconductor device.

Example Implementations

FIG. 1 illustrates a semiconductor device 100 in accordance with example implementations of the present disclosure. For purposes of description, the semiconductor device 100 is illustrated at wafer level prior to singulation of the device 100. As shown, the semiconductor device 100 includes a bottom die (substrate) that is formed as part of a bottom wafer 102 and a top die (substrate) which is formed as part of a top wafer 104. The bottom and top dies include one or more integrated circuits (not shown), which are formed in the wafers 102, 104. As illustrated in FIG. 1, the top wafer 104 further includes one or more alignment marks 106. The alignment marks 106 may be utilized to align the top wafer 104 with a carrier wafer (described herein below). The bottom wafer 102 has a first (top) surface 108 and a second surface 110. The top wafer 104 also has a first (upper) surface 112 and a second (bottom) surface 114. The integrated circuits are formed (e.g., fabricated) proximate to the first surface 108 of the bottom wafer 102 and the first surface 112 of the top wafer 104. It is contemplated that the surfaces 108 and 112 of the wafers 102, 104 may be planarized or unplanarized.

The wafers 102, 104 comprise a base material utilized to form one or more integrated circuit devices through various fabrication techniques such as photolithography, ion implantation, deposition, etching, and so forth. The wafers 102, 104 may be configured in a variety of ways. For example, the wafers 102, 104 may comprise an n-type silicon wafer or a p-type silicon wafer. In an implementation, the wafers 102, 104 may comprise group V elements (e.g., phosphorus, arsenic, antimony, etc.) configured to furnish n-type charge carrier elements. In another implementation, the wafers 102, 104 may comprise group IIIA elements (e.g., boron, etc.) configured to furnish p-type charge carrier elements.

The integrated circuits may be configured in a variety of ways. For example, the integrated circuits may be digital integrated circuits, analog integrated circuits, mixed-signal circuits, and so forth. In one or more implementations, the integrated circuits may comprise digital logic devices, analog devices (e.g., amplifiers, etc.), combinations thereof, and so forth. As described above, the integrated circuits may be fabricated utilizing various fabrication techniques. For example, the integrated circuits may be fabricated via one or more semiconductor fabrication techniques. For example, the integrated circuits may be fabricated via complimentary metal-oxide-semiconductor (CMOS) techniques, bi-polar semiconductor techniques, and so on.

As shown in FIG. 1, the device 100 also includes one or more area arrays of conductive layers 116 of the wafers 102, 104. In an implementation, the conductive layers 116 may comprise one or more conductive (e.g., contact) pads, redistribution structures, or the like. In a further implementation, the conductive layers 116 may comprise seed metal and/or barrier metal layers to allow for plated-line formation. The number and configuration of conductive layers 116 may vary depending on the complexity and configuration of the integrated circuits, and so forth. The conductive layers 116 provide electrical contacts through which the integrated circuits are interconnected to other components, such as printed circuit boards (not shown), when the devices 100 are configured as wafer-level packaging (WLP) devices or other integrated circuits disposed within the device 100. In one or more implementations, the conductive layers 116 may comprise an electrically conductive material, such as a metal material (e.g., aluminum, copper, etc.), or the like.

The conductive layers 116 may furnish electrical interconnection between various electrical components associated with the device 100. For instance, a first conductive layer 116 deployed over the bottom wafer 102 may furnish an electrical interconnection to a second conductive layer 116 deployed over the top wafer 104. In another instance, a conductive layer 116 deployed over the top wafer 104 may provide electrical interconnection with one or more solder bumps 118. Solder bumps 118 are provided to furnish mechanical and/or electrical interconnection between the conductive layers 116 and corresponding pads (not shown) formed on the surface of a printed circuit board (not shown). In one or more implementations, the solder bumps 118 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. However, it is contemplated that Tin-Lead (PbSn) solders may be used.

Bump interfaces 120 may be applied to the conductive layers 116 to provide a reliable interconnect boundary between the conductive layers 116 and the solder bumps 118. For instance, in the semiconductor device 100 shown in FIG. 1, the bump interface 120 comprises under-bump metallization (UBM) 122 applied to the conductive layers 116 of the integrated circuit chip 102. The UBM 122 may have a variety of compositions. For example, the UBM 122 include multiple layers of different metals (e.g., Aluminum (Al), Nickel (Ni), Copper (Cu), etc.) that function as an adhesion layer, a diffusion barrier layer, a solderable layer, an oxidation barrier layer, and so forth. However, other UBM structures are possible.

In one or more implementations, the device 100 may employ a Redistribution Layer ("RDL") configuration. The RDL configuration employs a redistribution structure 124 comprised of a thin-film metal (e.g., aluminum, copper, etc.) rerouting and interconnection system that redistributes the conductive layers 116 to an area array of bump interfaces 120 (e.g., UBM pads) that may be more evenly deployed over the surface of the device 100. The solder bumps 118 are subsequently placed over these bump interfaces 120 to form bump assemblies 126.

As illustrated in FIG. 1, the redistribution layer 124 may include wings 124A, 124B to provide further structural support to the solder bumps 118. The structural support may reduce the stress to the device 100, which may prevent the cracking of the device 100 during various testing phases (e.g., temperature cycling, drop testing, etc.). In one or more implementations, the wings 124A, 124B provide a redistribution layer 124 extension that may extend to approximately the width (W) of the solder bump 118. However, it is contemplated that the wings 124A, 124B may extend beyond (e.g., greater than) the width (W) of the solder bumps 118 in some implementations and may not extend (e.g., less than) the width (W) of the solder bumps 118 in other implementations. It is contemplated that the extension of the wings 124A, 124B may vary depending on the various characteristics of the device 100, such as the structural requirements of the device 100, the power requirements of the device 100, and so forth.

While FIG. 1 illustrates a device 100 that employs a Redistribution Layer ("RDL") configuration, it is contemplated that the device 100 illustrated and described herein may also employ a Bump-On-Pad ("BOP") configuration. The BOP configuration may employ a conductive layer 116 disposed under the bump interface 120 (e.g., UBM pads).

Viewed together, the solder bumps 118 and associated bump interfaces 120 (e.g., UBM 122) comprise bump assemblies 126 that are configured to provide mechanical and/or electrical interconnection of the integrated circuit(s) 106 to the printed circuit board (not shown).

The device 100 further includes a patterned adhesive material 128 disposed between the bottom wafer 102 and the top wafer 104. The patterned adhesive material 128 is configured to bond the bottom wafer 102 and the top wafer 104. The patterned adhesive material 128 may be configured in a variety of ways. For example, the patterned adhesive material 128 may be an adhesive dielectric material such as benzocyclobutene (BCB), or the like. The patterned adhesive material 128 is configured to be patterned (e.g., not continuous) to allow for lateral expansion when the material 128 is pressed vertically (e.g., top wafer 104 is brought into contact with the material 128) for bonding purposes. For example, the patterned adhesive material 128 is coated at least partially over the first surface 108 of the bottom wafer 102 and then patterned to allow the material 128 to reflow laterally during the bonding procedure. Moreover, the adhesive material 128 helps to planarize the top surface 108 (e.g., when the bottom wafer 102 is non-planarized) during reflow of the material 128 over the surface 108.

The device 100 also includes a via 130 (e.g., a through-substrate via (TSV)) that extends through the top wafer 104 and the patterned adhesive material 128 to at least one conductive layer 116 of the bottom wafer 102. As illustrated in FIG. 1, the via 130 includes a conductive material 132 that furnishes an electrical interconnection between a first conductive layer 116 of wafer 102 and a second conductive layer 116 of the wafer 104. In one or more implementations, the conductive material 132 may comprise a metal material, such as copper, or the like. For instance, the via 130 may provide an electrical interconnection between a first integrated circuit formed in the bottom wafer 102 and a second integrated circuit formed in the top wafer 104.

The via 130 also includes an insulating liner 134 to electrically isolate the conductive material 132 disposed in the via 130 from the top wafer 104. As illustrated in FIG. 1, the insulating liner 134 is deposited in the via 130 such that the liner 134 extends through the via 130 at least substantially the thickness (T1) of the top wafer 104 (e.g., the top surface 112 to the bottom surface 114), as well as at least substantially the thickness (T2) of the patterned adhesive material 128 to the conductive pad 116 deployed over the surface 108. The insulating liner 134 may be configured in a variety of ways. For example, the insulating liner 134 may be an insulating material, such as an oxide material, a nitride material, or the like. The insulating liner 134 is formed by depositing the insulating material in the via 130 and then etching the insulating material to form the liner 134 along the sides of the via. In one or more implementations, the insulating material may be deposited via plasma enhanced chemical vapor deposition (PECVD) techniques and then anisotropically etching the insulating material down to the contact pad 116 to form the liner 134. In one or more implementations, the insulating material may be a silicon dioxide ($SiO_2$) material, or the like.

While two (2) wafers (e.g., wafers 102, 104) are shown in FIG. 1, it is contemplated that the device 100 may employ three or more wafers stacked and bonded together. For example, a third wafer may be positioned over the wafer 104 and one or more vias formed therein. In an implementation, the third wafer may include a first through-substrate via extending to a first conductive layer 116 deployed over the bottom wafer 102. In this implementation, the wafer 104 may include a second through-silicon via extending to a second conductive layer 116 deployed over the bottom wafer 104. In another implementation, the third wafer may include a first through-silicon via extending to a first conductive layer 116 deployed over the wafer 104, as well as a second through-silicon via extending to a second conductive layer 116 deployed over the bottom wafer 102. It is contemplated that many through-silicon via configurations may be utilized depending on the characteristics of device 100 (e.g., design requirements, structural requirements, etc.).

In accordance with the present disclosure, a device 100 includes at least two wafers (e.g., wafers 102, 104 shown in FIG. 1) bonded together via a patterned adhesive material 128. The patterned adhesive material 128 may be selectively patterned before the top wafer 104 is positioned over the bottom wafer 102 and in contact with material 128. The selective patterning may allow the material 128 to reflow laterally during the bonding procedure. Once the bonding procedure is complete (e.g., after curing of the patterned adhesive material 128, etc.), a via 130 is formed that extends through the top wafer 104 and the material 128 to a conductive layer 116 deployed over the top surface 108 of the bottom wafer 102. The conductive layer 116 of the bottom wafer 102 is configured to provide an electrical interconnection with one or more integrated circuits formed in the wafer 102. The via 130 includes a conductive material 132 that further provides an interconnection between the conductive layer 116 of the bottom wafer 102 to a conductive layer 116 of the top wafer 104 so that the integrated circuit of the bottom wafer 102 is electrically connected to an integrated circuit formed in the top wafer 104. Once the fabrication is complete, suitable wafer-level packaging processes may be employed to segment and package the individual semiconductor device 100. In one or more implementations, the segmented semiconductor devices may comprise wafer chip-scale package devices.

Example Fabrication Processes

Figure 2:
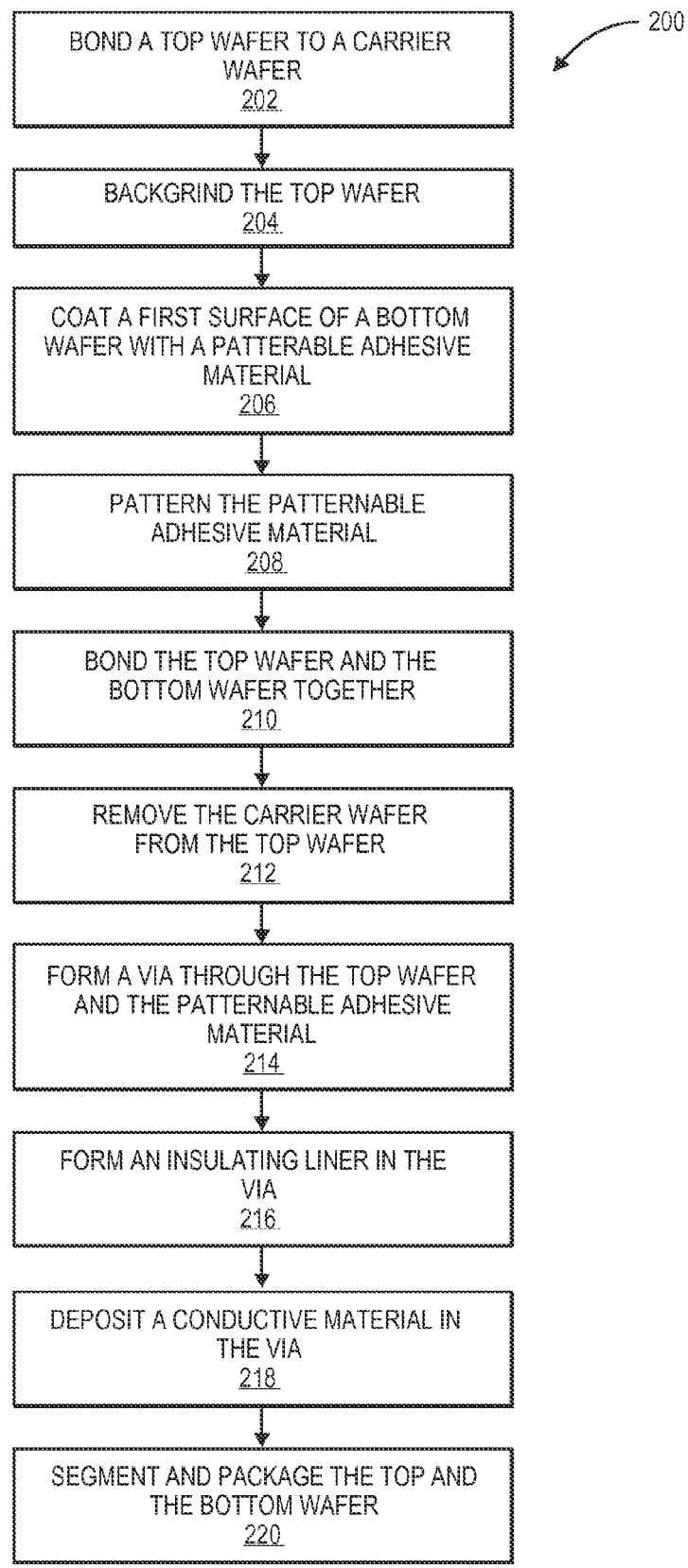
FIG. 2 is a flow diagram illustrating a process in an example implementation for fabricating semiconductor devices, such as the device shown in FIG. 1.

FIG. 2 illustrates an example process 200 that employs wafer-level packaging techniques to fabricate three-dimensional semiconductor devices, such as the device 100 shown in FIG. 1. FIGS. 3 through 7 illustrate sections of example wafers that may be utilized to fabricate semiconductor devices 300 (such as device 100) shown in FIG. 1. A top wafer, such as wafer 302 shown in FIG. 3, includes a first surface 304 and a second surface 306. The wafer 302 includes one or more integrated circuits (not shown) formed proximate to the second surface 306. The integrated circuits are connected to one or more contact pads 334 (e.g., a metal pad, etc.) that are configured to provide electrical contacts through which the integrated circuits are interconnected to other components (e.g., other integrated circuits, printed circuit boards, etc.) associated with device 300. The wafer 302 may further include one or more interconnect layer(s) 308 formed of various conducting and insulating materials, such as silicon dioxide ($SiO_2$), aluminum, copper, tungsten, and so forth between the contact pads 334 and the second surface 306. The passivation layer 309 covers the interconnect layer(s) 308 and the pad layer 334 to provide protection and insulation to the integrated circuits. The passivation layer 309 can be either planarized or non-planar and will have holes patterned through layer 309 to provide access to the contact pads 334.

Figure 3:
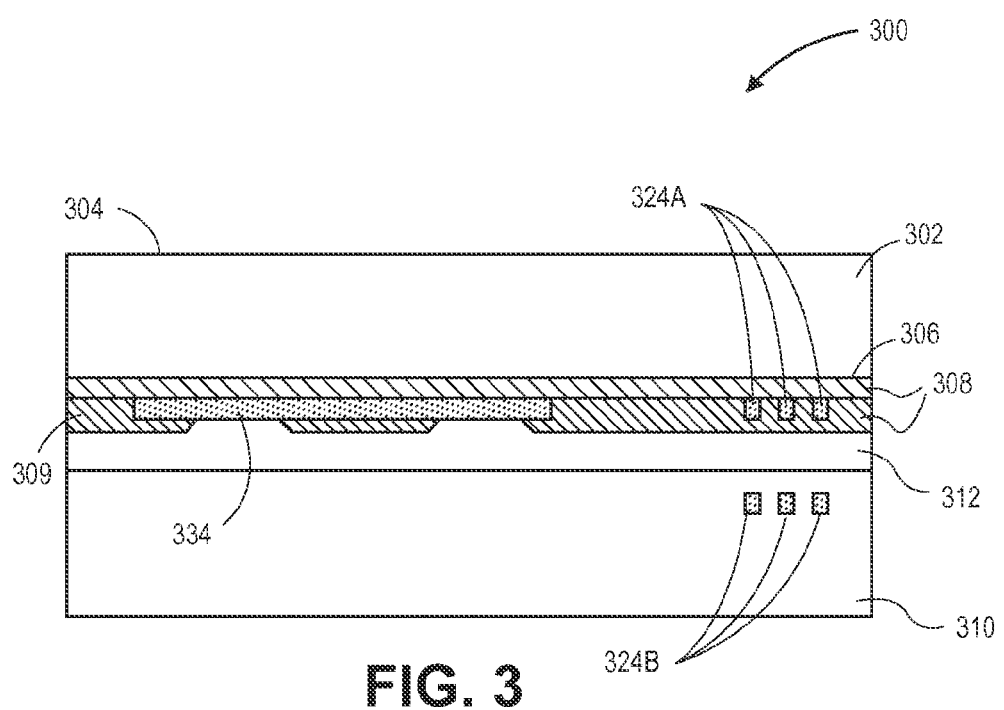
FIG. 3 is a diagrammatic partial cross-sectional view illustrating the fabrication of wafer-level packaged semiconductor devices, such as the semiconductor device shown in FIG. 1, in an example implementation, wherein the top wafer is shown bonded to a carrier wafer.

As illustrated in FIG. 2, a top wafer is bonded to a carrier wafer (Block 202). For example, as shown in FIG. 3, the top wafer 302 is bonded to a carrier wafer 310 via a temporary adhesive material 312. In one or more implementations, the temporary adhesive material 312 may be a soluble bonding agent or wax. The carrier wafer (e.g., carrier wafer 310) is configured to provide structural support to the top wafer (e.g., top wafer 302) during one or more backgrinding processes. Once the carrier wafer is bonded to the top wafer, a backgrinding process is applied to the back side of the top wafer (e.g., the side including the first surface) to allow for stacking and high density packaging of the semiconductor devices (Block 204).

Figure 4:
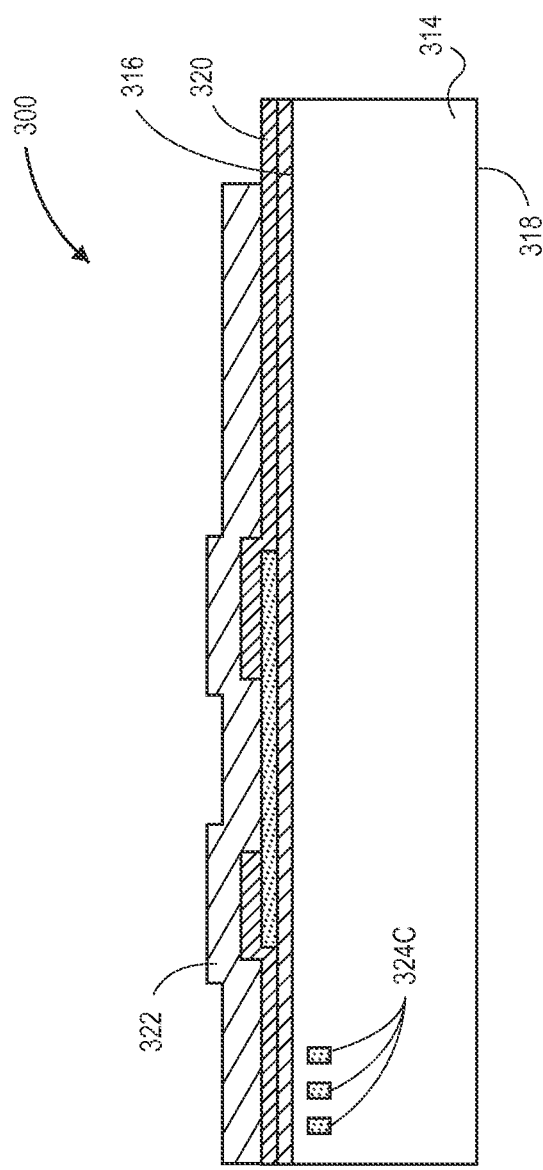
FIG. 4 is a diagrammatic partial cross-sectional view illustrating the fabrication of wafer-level packaged semiconductor devices, such as the semiconductor device shown in FIG. 1, in an example implementation, wherein a first (upper) surface of the bottom wafer is provided with a patterned adhesive material.

As illustrated in FIG. 4, the device 300 includes a bottom wafer 314 having a first surface 316 and a second surface 318. The first surface 316 includes one or more integrated circuits formed therein. The integrated circuits are connected to one or more contact pads to provide electrical interconnection between the integrated circuits and other components associated with the device 300 (e.g., other integrated circuits, printed circuit boards, etc.) A passivation layer 320 (e.g., $SiO_2$) at least partially covers the first surface 316 to provide protection to the integrated circuits from later fabrication steps.

As illustrated in FIG. 2, a first surface of a bottom wafer is coated with a patterned adhesive material (Block 206). The patterned adhesive material may be configured as an adhesive dielectric, such as benzocyclobutene (BCB), or the like. Once the patterned adhesive material is applied to the bottom wafer, the patterned adhesive material is patterned (Block 208) to allow for lateral expansion of the patterned adhesive material (e.g., patterned adhesive material 322 shown in FIG. 4) when the first surface (e.g., surface 304) of the top wafer (e.g., wafer 302) is pressed into contact with the patterned adhesive material. The patterned adhesive material 322 may assist in planarizing the passivation layer 320 during a reflow process. The top wafer and the bottom wafer are then bonded together (Block 210). It is contemplated that once the top wafer and the bottom wafer are bonded together, a curing process may be utilized to further harden the patterned adhesive material. It is further contemplated that the top wafer and the bottom wafer may be planarized or un-planarized prior to the Block 210 bonding step.

It is contemplated that various aligning procedures may be employed to align the wafers 302, 310, 314. In an implementation, alignment marking techniques may be utilized to align each wafer. For instance, the top wafer 302 and the carrier wafer 310 may include one or more alignment marks 324A, 324B, respectively, to properly align the carrier wafer 310 and the top wafer 302 during bonding. Moreover, the bottom wafer 314 may include one or more alignment marks 324C to align the carrier wafer 310 to the bottom wafer 314 so that the top wafer 302 is aligned with the bottom wafer 314. In another implementation, visible light/infrared light alignment techniques may be utilized to align each wafer. For instance, a top visible light source (not shown) positioned above the wafers provides visible light to properly align the bottom wafer 314. Then, a top infrared light detector (not shown) positioned above the wafers, in combination with a bottom infrared source positioned below the wafers, allow for positioning of the carrier wafer 310 and the top wafer 302. The infrared optics are configured to provide an infrared light such that an operator, with proper magnification and visualization equipment, can see through the carrier wafer 310 and the back-grinded top wafer 302 to allow for proper alignment of the wafers 302, 310 with the already properly aligned bottom wafer 314.

Figure 5:
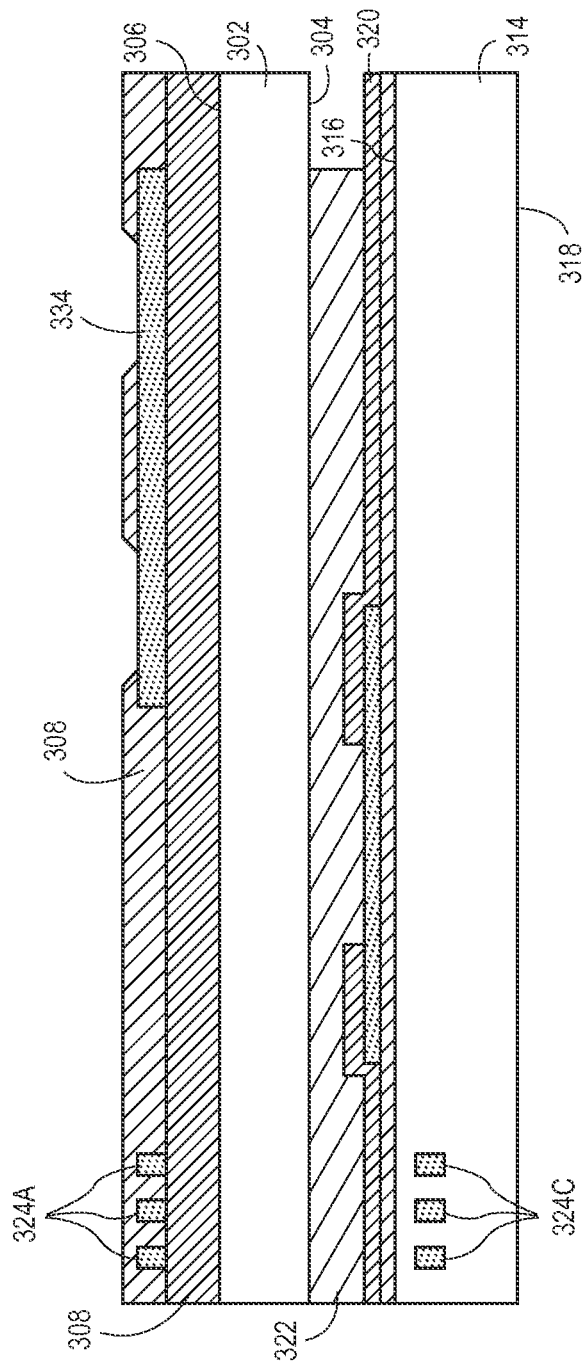
FIG. 5 is a diagrammatic partial cross-sectional view illustrating the fabrication of wafer-level packaged semiconductor devices, such as the semiconductor device shown in FIG. 1, in an example implementation, wherein the top wafer and the bottom wafer are shown bonded together with the patterned adhesive material.
Figure 6:
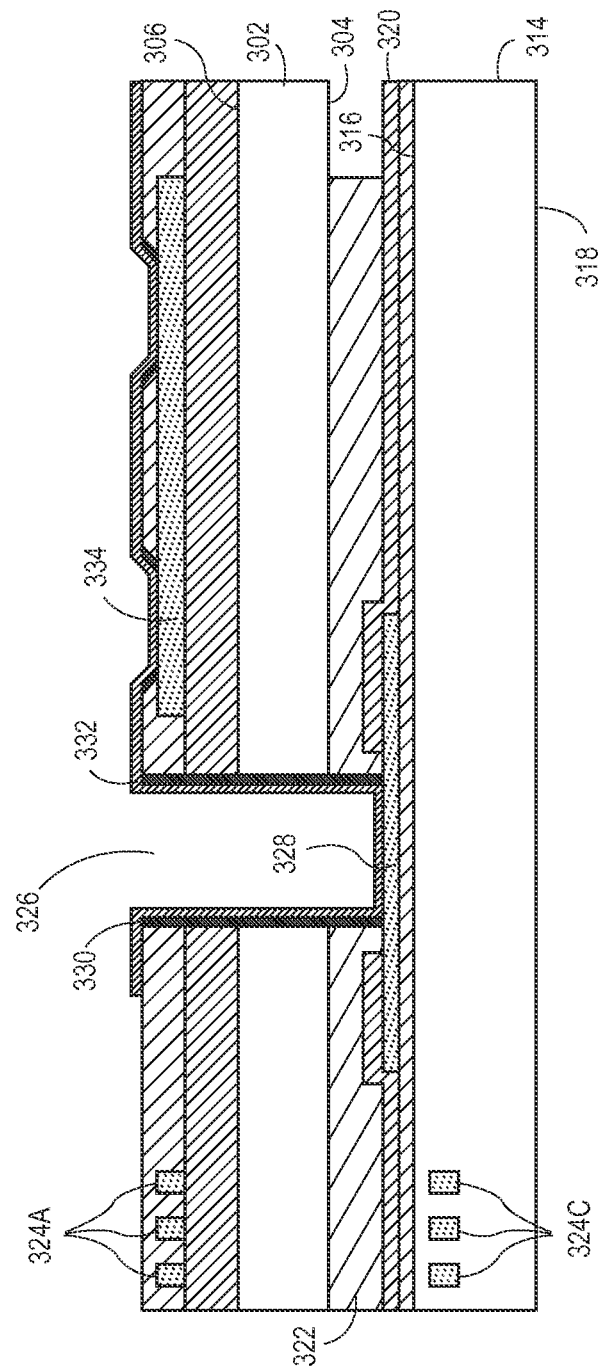
FIG. 6 is a diagrammatic partial cross-sectional view illustrating the fabrication of wafer-level packaged semiconductor devices, such as the semiconductor device shown in FIG. 1, in an example implementation, wherein a via is formed through the top wafer and the patterned adhesive material to a conductive pad disposed on the first surface of the bottom wafer.

The carrier wafer is then removed from the top wafer (Block 212) by heating the temporary adhesive material (e.g., temporary adhesive material 312) sufficiently to allow for removal of the carrier wafer (e.g., carrier wafer 310) (see FIG. 5). A via is then formed through the top wafer and the patterned adhesive material (Block 214) down to a conductive layer disposed over the first surface of the bottom wafer. The via is formed by etching an aperture through the top wafer and the adhesive material. As illustrated in FIG. 6, a via 326 is formed through the top wafer 302 and the patterned adhesive material 322 via one or more photolithography and etching techniques. For instance, once the wafer 302 is patterned, an etch to remove the various insulation layers (e.g., passivation layers 309), top wafer 302 silicon, adhesive material 322, and so forth, is performed. The etching step is configured to form the via 326 and to stop on the conductive layer (e.g., conductive pad) 328 of the bottom wafer 314. It is contemplated that various etching techniques (e.g., dry etch, wet etch, etc.) may be utilized depending on the requirements of the device 300, the via 326, and so forth.

An insulating liner is formed in the via (Block 216) to electrically isolate the top wafer from the via. In an implementation, an insulating material is first deposited via plasma enhanced chemical vapor deposition (PECVD) techniques and then anisotropically etching the insulating material down to the conductive layer 328 to form the insulating liner 330 as shown in FIG. 6. Moreover, as shown in FIG. 6, a diffusion barrier metal 332 (e.g., Ti, etc.) and a seed metal 332 are deposited over the second surface 306 of the top wafer 302. The barrier metal 332 and the seed metal 332 may be patterned (e.g., via photolithography) to further provide electrical interconnections between the top wafer 302 and the bottom wafer 314 at later fabrication stages (e.g., between the conductive layer 328 of the bottom wafer 314 and a conductive layer 334 formed over the second surface 306 of the top wafer 302).

A conductive material is then deposited in via (Block 218) to provide an electrical interconnection between the bottom wafer and the top wafer. For instance, as illustrated in FIG. 7, a conductive material 336 (e.g., copper, or the like) is deposited in the via 330 to form an electrical interconnection between the conductive layer 328 of the bottom wafer 318 and the conductive layer 334 of the top wafer 302. In one or more implementations, the conductive material 336 is selectively plated-up via electroplating to form the electrical interconnections. Moreover, in one or more implementations, the conductive material 336 deposited in the via may also serve as the conductive material utilized for a redistribution structure, such as the redistribution structure 124 shown in FIG. 1. Thus, the deposition of the conductive material in the via may also result in the formation of a redistribution structure. It is contemplated that further semiconductor fabrication techniques may be utilized to finalize the device 300 fabrication process. For instance, further stripping of photoresist, etching of the seed and barrier metals 332 to electrically isolate plated-up lines, and depositing of passivation layers may be incorporated. For example, seed and barrier metal in unplated areas may be removed to form the electrical interconnections.

Once the wafer fabrication process is complete, suitable wafer-level packaging processes may be employed to segment and package the individual semiconductor devices (Block 220). In one or more implementations, the segmented semiconductor devices may comprise wafer chip-scale package devices.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
   a top substrate having a first surface and a second surface, the top substrate including a conductive layer disposed over the second surface;
   a bottom substrate having a first surface, an integrated circuit disposed proximate to the first surface, and a conductive pad disposed in the first surface, the integrated circuit electrically coupled to the conductive pad;
   a patterned adhesive material disposed between the first surface of the top substrate and the first surface of the bottom substrate, the patterned adhesive material configured to bond the bottom substrate to the top substrate, the patterned adhesive material comprising a non-discrete non-continuous material configured to allow for expansion when the patterned adhesive material is pressed vertically; and
   a via formed through the top substrate and the patterned adhesive material, the via including a conductive material configured to electrically couple the conductive pad of the bottom substrate to the conductive layer of the top substrate.

2. The semiconductor device as recited in claim 1, wherein the patterned adhesive material comprises a patterned dielectric.

3. The semiconductor device as recited in claim 2, wherein the patterned dielectric comprises benzocyclobutene (BCB).

4. The semiconductor device as recited in claim 1, wherein the via further includes an insulating liner configured to electrically isolate the top wafer and the patterned adhesive material from the conductive material disposed in the via.

5. The semiconductor device as recited in claim 4, wherein the insulating liner extends at least substantially through the thickness of the top wafer and at least substantially through the thickness of the patterned adhesive material.

6. The semiconductor device as recited in claim 5, wherein the insulating liner comprises silicon dioxide.

7. The semiconductor device as recited in claim 6, wherein the conductive material comprises a seed layer of copper formed over the insulating liner.

8. The semiconductor device as recited in claim 1, wherein the conductive material comprises copper.

9. The semiconductor device as recited in claim 1, wherein the conductive material extends from the via to form a redistribution structure proximate to the second surface of the top substrate.

10. The semiconductor device as recited in claim 1, further comprising a solder bump assembly electrically coupled to the conductive layer.

* * * * *